(12) United States Patent
Rajski et al.

(10) Patent No.: US 9,720,041 B2
(45) Date of Patent: Aug. 1, 2017

(54) SCAN-BASED TEST ARCHITECTURE FOR INTERCONNECTS IN STACKED DESIGNS

(71) Applicant: Mentor Graphics Corporation, Wilsonville, OR (US)

(72) Inventors: Janusz Rajski, West Linn, OR (US); Jerzy Tyszer, Poznan (PL)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/170,804

(22) Filed: Feb. 3, 2014

(65) Prior Publication Data

US 2014/0223247 A1 Aug. 7, 2014

Related U.S. Application Data

(60) Provisional application No. 61/760,009, filed on Feb. 1, 2013.

(51) Int. Cl.
*G01R 31/28* (2006.01)
*G01R 31/3185* (2006.01)

(52) U.S. Cl.
CPC .......... *G01R 31/318563* (2013.01); *G01R 31/318513* (2013.01)

(58) Field of Classification Search
None
See application file for complete search history.

(56) References Cited

U.S. PATENT DOCUMENTS

| | | | | |
|---|---|---|---|---|
| 2003/0229886 | A1* | 12/2003 | Hasegawa et al. | 717/115 |
| 2004/0246337 | A1* | 12/2004 | Hasegawa et al. | 348/189 |
| 2010/0138707 | A1* | 6/2010 | Yanagida | 714/726 |
| 2010/0185410 | A1* | 7/2010 | Bartley et al. | 702/120 |
| 2010/0332177 | A1* | 12/2010 | Wu et al. | 702/117 |
| 2011/0012633 | A1* | 1/2011 | Rahman et al. | 324/754.07 |
| 2012/0280231 | A1* | 11/2012 | Ito et al. | 257/48 |
| 2013/0159799 | A1* | 6/2013 | Brown et al. | 714/726 |

OTHER PUBLICATIONS

B. Chakraborty and M. Dalui, "A Cellular Automata Based Test Scheme for TSVs in 3D ICs," Proc. ICDCS, 2012, pp. 723-727.
P.-Y. Chen, C.-W. Wu, and D.-M. Kwai, "On-chip TSV Testing for 3D IC before Bonding Using Sense Amplification," ATS, 2009, pp. 450-455.
Y. Cheng, L. Zhang, Y. Han, J. Liu, and X. Li, "Wrapper Chain Design for Testing TSVs Minimization in Circuit-Partitioned 3D SoC," ATS, 2011, pp. 181-186.

(Continued)

*Primary Examiner* — Daniel McMahon
(74) *Attorney, Agent, or Firm* — Banner & Witcoff, Ltd.

(57) ABSTRACT

Aspects of the invention relate to scan-based test architecture for interconnects in stacked designs. The disclosed scan-based test architecture comprises a scan chain. Scan cells on the scan chain are configured to receive data from, based on bits of a control signal, outputs of neighboring scan cells or outputs of mixing devices that combine data from through-silicon vias with data from the outputs of the neighboring scan cells. The scan-based test architecture can be used to identify single or multiple defective through-silicon vias.

22 Claims, 7 Drawing Sheets

(56) References Cited

OTHER PUBLICATIONS

M. Cho, C. Liu, D.H. Kim, S.K. Lim, and S. Mukhopadhyay, "Pre-Bond and Post-Bond Test and Signal Recovery Structure to Characterize and Repair TSV Defect Induced Signal Degradation in 3-D System," IEEE Trans. Components, Packaging and Manufacturing Technology, vol. 1, No. 11, pp. 1718-1727, Nov. 2011.

M. Gulbins, F. Hopsch, P. Schneider, B. Straube, and W. Vermeiren, "Developing Digital Test Sequences for Through-Silicon Vias within 3D Structures," 3DIC, 2010, pp. 1-6.

Y.-J. Huang and J.-F. Li, "Built-In Self-Repair Scheme for the TSVs in 3-D ICs," IEEE Trans. on CAD of ICs and Systems, vol. 31, No. 10, pp. 1600-1613, Oct. 2012.

Y.-J. Huang, J.-F. Li, and C.-W. Chou, "Post-Bond Test Techniques for TSVs with Crosstalk Faults in 3D ICs," VLSI-DAT, 2012, pp. 1-4.

L. Jiang, Q. Xu, and B. Eklow, "On Effective Through-Silicon Via Repair for 3-D-Stacked ICs," IEEE Trans. CAD of ICs and Systems, vol. 32, No. 4, pp. 559-571, Apr. 2013.

N. Kandalaft, R. Rashidzadeh, and M. Ahmadi, "Testing 3-D IC Through-Silicon-Vias (TSVs) by Direct Probing," IEEE Trans. CAD of ICs and Systems, vol. 32, No. 4, pp. 538-546, Apr. 2013.

Y.-H. Lin and S.-Y. Huang, "A Unified Method for Parametric Fault Characterization of Post-Bond TSVs," ITC, 2012, Paper 12.1.

I. Loi, S. Mitra, T.-H. Lee, S. Fujita, and L. Benini, "A Low-overhead Fault Tolerance Scheme for TSV-based 3D Network on Chip Links," ICCAD 2008, pp. 598-602.

E.J. Marinissen, C.-C. Chi, M. Konijnenburg, and J. Verbree, "A DfT Architecture for 3D-SIGs Based on a Standardizable Die Wrapper," J. of Electron Test, vol. 28, No. 1, pp. 73-92, 2012.

E.J. Marinissen, J. Verbree, and M. Konijnenburg, "A Structured and Scalable Test Access Architecture for TSV-Based 3D Stacked ICs," IEEE VTS, 2010, pp. 269-274.

E.J. Marinissen, and Y. Zorian, "Testing 3D Chips Containing Through-Silicon Vias," ITC, 2009, Paper ET1.1.

B. Noia, K. Chakrabarty, S.K. Goel, E.J. Marinissen, and J. Verbree, "Test-Architecture Optimization and Test Scheduling for TSV-Based 3-D Stacked ICs," IEEE Trans. on CAD of ICs and Systems, vol. 30, No. 11, pp. 1705-1718, Nov. 2011.

B. Noia and K. Chakrabarty "Identification of Defective TSVs in Pre-Bond Testing of 3D ICs," ATS, 2011, pp. 187-194.

B. Noia and K. Chakrabarty "Testing and Design-for-Testability Techniques for 3D Integrated Circuits," ATS, 2011, pp. 474-479.

B. Noia and K. Chakrabarty "Pre-Bond Probing of Through-Silicon Vias in 3-D Stacked ICs," IEEE Trans. on CAD of ICs and Systems, vol. 32, No. 4, pp. 547-558, Apr. 2013.

B. Noia, K. K Chakrabarty and E.J. Marinissen, "Optimization Methods for Post-Bond Testing of 3D Stacked ICs," J. of Electron Test, vol. 28, No. 1, pp. 103-120, 2012.

B. Noia, S. Panth, K. Chakrabarty and S.K. Lim, "Scan Test of Die Logic in 3D ICs Using TSV Probing," ITC, 2012, Paper 12.3.

C.-Y. Pai, R.-T. Cu, B.-C. Cheng, L.-B. Chen, and K. S.-M. Li, "A Unified Interconnects Testing Scheme for 3D Integrated Circuits," ATS, 2011, pp. 195-200.

S.K. Roy, C. Giri, A. Chakraborty, S. Mukherjee, D.K. Das, and H. Rahaman, "Optimizing Test Architecture for TSV based 3D Stacked ICs using Hard SOCs," ISED, 2011, pp. 230-235.

K. Smith, P. Hanaway, M. Jolley, R. Gleason, E. Strid, T. Daenen, L. Dupas, B. Knuts, E.J. Marinissen, and M. Van Dievel, "Evaluation of TSV and Probing for Wide I/O Testing," Proc. ITC, 2011, Paper 17.2.

O. Yaglioglu and B. Eldridge, "Direct Connection and Testing of TSV and Microbump Devices Using NanoPierce Contactor for 3D-IC Integration," IEEE VTS, 2012, pp. 96-101.

X. Wu, K. Charkrabarty, Y. Xie, "Scan-Chain Design and Optimization for Three-Dimensional Integrated Circuits," ACM J. Emerging Technologies in Computing Systems, vol. 5, No. 2, Article 9, Jul. 2008.

Y. Zhao, S. Khursheed, and B.M. Al-Hashimi, "Cost-Effective TSV Grouping for Yield Improvement of 3D-ICs," ATS, 2011, pp. 201-206.

* cited by examiner

TABLE I. EXPERIMENTAL RESULTS – SINGLEFAULT COVERAGE [%] FOR PSEUDO RANDOM TEST PATTERNS

| TSVs # | 500 | | | | 1000 | | | | 2000 | | | |
|---|---|---|---|---|---|---|---|---|---|---|---|---|
| MISR size | 6 | 8 | 12 | 16 | 8 | 12 | 16 | 20 | 8 | 16 | 24 | 32 |
| Patterns | | | | | 5 | | | | | | | |
| Stuck-at-0 | 98.40 | 100 | 100 | 100 | 99.50 | 99.90 | 100 | 100 | 99.70 | 100 | 100 | 100 |
| Stuck-at-1 | 98.40 | 99.80 | 99.40 | 100 | 99.90 | 100 | 100 | 100 | 100 | 100 | 100 | 100 |
| AND short | 98.39 | 100 | 100 | 100 | 99.90 | 100 | 100 | 100 | 99.45 | 100 | 100 | 100 |
| OR short | 99.20 | 99.78 | 100 | 100 | 99.70 | 100 | 100 | 100 | 99.90 | 100 | 100 | 100 |
| Dom. short | 97.99 | 100 | 100 | 100 | 99.70 | 100 | 100 | 100 | 99.85 | 100 | 100 | 100 |
| Slow to fall | 98.40 | 99.80 | 100 | 100 | 99.60 | 99.90 | 100 | 100 | 99.70 | 100 | 100 | 100 |
| Slow to rise | 97.40 | 99.40 | 100 | 100 | 99.70 | 100 | 100 | 100 | 99.50 | 100 | 100 | 100 |
| Crosstalk | 98.60 | 100 | 100 | 100 | 99.70 | 100 | 100 | 100 | 99.75 | 100 | 100 | 100 |
| Resolution | 0.00 | 0.00 | 36.99 | 93.99 | 0.00 | 14.16 | 88.64 | 99.24 | 0.00 | 78.48 | 99.93 | 100 |
| Patterns | | | | | 10 | | | | | | | |
| Stuck-at-0 | 98.60 | 99.40 | 100 | 100 | 99.50 | 100 | 100 | 100 | 99.50 | 100 | 100 | 100 |
| Stuck-at-1 | 98.40 | 100 | 100 | 100 | 100 | 99.90 | 100 | 100 | 99.45 | 100 | 100 | 100 |
| AND short | 98.60 | 100 | 100 | 100 | 99.70 | 100 | 100 | 100 | 99.45 | 100 | 100 | 100 |
| OR short | 99.20 | 99.80 | 100 | 100 | 99.90 | 100 | 100 | 100 | 99.80 | 100 | 100 | 100 |
| Dom. short | 98.20 | 99.60 | 100 | 100 | 99.70 | 100 | 100 | 100 | 99.40 | 100 | 100 | 100 |
| Slow to fall | 97.60 | 99.40 | 100 | 100 | 99.70 | 100 | 100 | 100 | 99.60 | 100 | 100 | 100 |
| Slow to rise | 99.00 | 99.40 | 100 | 100 | 99.20 | 99.80 | 100 | 100 | 99.40 | 100 | 100 | 100 |
| Crosstalk | 98.80 | 99.80 | 100 | 100 | 99.70 | 100 | 100 | 100 | 99.75 | 100 | 100 | 100 |
| Resolution | 0.00 | 0.00 | 38.01 | 94.77 | 0.00 | 13.81 | 88.49 | 99.32 | 0.00 | 77.23 | 99.92 | 100 |
| Patterns | | | | | 15 | | | | | | | |
| Stuck-at-0 | 98.00 | 100 | 100 | 100 | 99.70 | 100 | 100 | 100 | 99.85 | 100 | 100 | 100 |
| Stuck-at-1 | 98.60 | 99.80 | 100 | 100 | 99.40 | 99.70 | 100 | 100 | 99.90 | 100 | 100 | 100 |
| AND short | 97.80 | 99.20 | 100 | 100 | 100 | 100 | 100 | 100 | 99.50 | 100 | 100 | 100 |
| OR short | 98.40 | 100 | 100 | 100 | 99.50 | 100 | 100 | 100 | 99.60 | 100 | 100 | 100 |
| Dom. short | 96.60 | 100 | 100 | 100 | 99.60 | 100 | 100 | 100 | 99.40 | 100 | 100 | 100 |
| Slow to fall | 99.00 | 99.40 | 100 | 100 | 99.60 | 100 | 100 | 100 | 99.60 | 100 | 100 | 100 |
| Slow to rise | 97.20 | 100 | 100 | 100 | 99.80 | 100 | 100 | 100 | 99.60 | 100 | 100 | 100 |
| Crosstalk | 97.19 | 99.80 | 100 | 100 | 99.70 | 100 | 100 | 100 | 99.70 | 100 | 100 | 100 |
| Resolution | 0.00 | 0.00 | 37.51 | 94.04 | 0.00 | 14.76 | 88.78 | 99.02 | 0.00 | 78.89 | 99.95 | 100 |

FIG. 7

SCAN-BASED TEST ARCHITECTURE FOR INTERCONNECTS IN STACKED DESIGNS

RELATED APPLICATIONS

This application claims priority to U.S. Provisional Patent Application No. 61/760,009, filed on Feb. 1, 2013, and naming Janusz Rajski et al. as inventors, which application is incorporated entirely herein by reference.

FIELD OF THE INVENTION

The present invention relates to the field of integrated circuit (IC) testing technology. Various implementations of the invention may be particularly useful for testing and fault diagnosing interconnects of stacked integrated circuits.

BACKGROUND OF THE INVENTION

Expanding into the third dimension let chip manufacturers continue shrinking transistors to boost speed with no power leaks. However, chip stacking is limited by wiring-related problems. Today's interconnects do not run through the silicon itself but go millimeters around it, impeding speedy signaling and increasing power consumption along the way. 2-D (horizontal) real estate is also valuable. Even the thinnest interconnects must still be packed along the edges of a chip, imposing strict limits on how many input/output connections the chip can handle. Consequently, going vertical (3-D) by connecting one chip to another with lines that go straight through the silicon—commonly known as through-silicon vias (TSVs)—offers the numerous potential benefits. In particular, more connections can be packed side by side using much slimmer wires. Going through chips instead of around the side also reduces the length of interconnects from millimeters to microns or even less—as thin as individual wafers can be produced. It has been estimated that the switch to vertical interconnects may reduce power consumption in half, increase bandwidth by a factor of eight, and shrink memory stacks by some 35 percent.

As several hundreds of thousands of TSVs in a single package provide power/ground, clock, functional signals, as well as test access to logic blocks of different layers of the device, they become not only the key components of 3-D ICs but also make up a crucial test infrastructure. In order to form TSVs, one has to etch deep, narrow holes into a silicon wafer and then fill them with a nearly flawless layer of insulating material and then copper. But as a wafer heats up, copper expands at more than five times the rate that silicon does, exerting stress that can crack the wafer and render it useless. Because of such imperfect etching, ragged wafer surface, and potential wafer misalignments, certain TSVs in one wafer after thinning and polishing might not be completely exposed or aligned with their counterparts on the other wafer. Since the bonding quality of TSVs depends on the winding level of the thinned wafer as well as the surface roughness and cleanness of silicon dies, defective TSVs tend to occur in clusters, though even a single TSV defect between any two layers can void the entire chip stack, reducing the overall yield.

Numerous novel testing schemes for 3-D ICs, especially for those with TSV-based interconnects, have been proposed. Virtually all of them are motivated by 3-D processing steps such as thinning, alignment, or stacking that introduce new defects including voids, peeling, delamination, chipping, and cracking. These mechanisms can lead to both strong/weak opens and strong/weak shorts causing either no signal propagation through vias or propagation with a degraded amplitude/slew. Since maintaining the high signal quality is one of the primary objectives of 3-D system integration, it becomes imperative to properly identify defective TSVs and replace them, if needed, with spare fault-free ones by deploying appropriate diagnostic and subsequently self-repairing and/or rerouting strategies. It is worth noting that the pre-bond testing of TSVs is of particular difficulty, as the existing probe technologies may be unable to make contact with thousands of individual TSVs. Thus, there are methods allowing a probe card to contact TSVs without the need for probe pads. Moreover, several conventional techniques suffer from the fact that TSVs are single-ended at this stage of test. The existing methods use therefore either on-chip TSV monitoring in conjunction with a sense amplification technique or some forms of TSV network probing.

The post-bond stack testing ensures that a 3-D IC works as intended and no new defects are introduced during bonding and related operations. Many TSV test methods proposed for this phase include different types of BIST and scan-based schemes that target, in particular, TSV crosstalk faults. A cellular automata-based TSV test scheme has also been proposed. Other solutions aim at deriving test sequences for TSVs based on fault models at electrical levels. Some fault diagnosis techniques use thermography and electron microscopy with dispersive X-ray spectroscopy. A test access architecture allows both pre-bond die testing and post-bond stack testing by deploying a modular scheme, in which various dies, embedded IP cores, and TSV-based interconnects are tested as separate units to allow optimization of the IEEE 1500 standard-based 3-D IC test flow. As TSVs may aggravate routing congestions, it is often necessary to reduce their role in test. It has been observed that by varying connection orders of wrapper chain components, e.g., scan chains and I/O cells, the TSVs involved may vary significantly. One of the proposed structures can detect the signal degradation through vias due to resistive shorts and variations in resistance due to weak open and/or bonding resistance. For TSVs with moderate signal degradations, it reconfigures itself as a signal recovery circuit to maintain its quality. Many TSVs implemented in 3-D DRAMs are prone to open defects and couplings as shown by simulation studies modeling the faulty behavior of TSV opens as a key part of fault diagnosis. A semi-automated design flow for 3-D networks-on-chip uses a defect-tolerance scheme to increase the yield of stacked chips by starting from an accurate physical and geometrical model of TSVs. Other schemes either employ an IEEE 1500 compatible testing methodology for TSVs-based interconnects or are designed so that the overall test application time for 3-D ICs is optimized. A socket solution deploys a customized contactor for direct testing of TSVs and micro-bump arrays. It enables creation of good TSV dies for high yield stacking and good TSV stacks for shipment to system assemblers to achieve high yield assembly.

Although, as shown above, defect mechanisms may vary, some of the resulting TSV faults are similar to failures typically affecting wiring networks. As a result, one could leverage, to some extent, the existing test generation methods by assuming full controllability at the interconnect inputs and full observability at the interconnect outputs, as done, for example, in the boundary-scan architecture. Such algorithms detect most of the faults through test patterns that grow only logarithmically with the number of wires. This disclosure introduces a new scan-based test architecture for TSVs along with the corresponding post-bond test generation techniques capable of detecting and accurately identifying variety of single and multiple faults for TSVs in 3-D stacked ICs.

BRIEF SUMMARY OF THE INVENTION

Aspects of the invention relate to scan-based test architecture for interconnects in stacked designs.

In one aspect, there is an integrated circuit comprising a scan chain, scan cells on the scan chain configured to receive data from, based on bits of a control signal, outputs of neighboring scan cells or outputs of mixing devices that combine data from through-silicon vias with data from the outputs of the neighboring scan cells.

The control signal may be selected, based on a selection signal, from parallel outputs of a control register and a single signal line.

The mixing devices may be XOR gates.

The through-silicon vias may receive test stimuli supplied by a second scan chain on a neighboring die, the second scan chain being shifted in a direction opposite to that of the scan chain.

An integrated circuit according to the one aspect may further comprise a control register configured to shift and/or store the control signal.

An integrated circuit according to the one aspect may further comprise a comparator configured to compare serial output of the scan chain with a good machine response signal. The integrated circuit may still further comprise a counter and a plurality of AND gates configured to receive signals from outputs of the counter and output of the comparator.

In a further aspect, there is one or more non-transitory processor-readable media storing processor-executable instructions for causing one or more processors to create a design of an integrated circuit, the integrated circuit comprising: a scan chain, scan cells on the scan chain configured to receive data from, based on bits of a control signal, outputs of neighboring scan cells or outputs of mixing devices that combine data from through-silicon vias with data from the outputs of the neighboring scan cells.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 7 illustrates a table summarizing experimental results obtained by applying robust test patterns to the test architecture shown in FIG. 2.

DETAILED DESCRIPTION OF THE INVENTION

Figure 1:
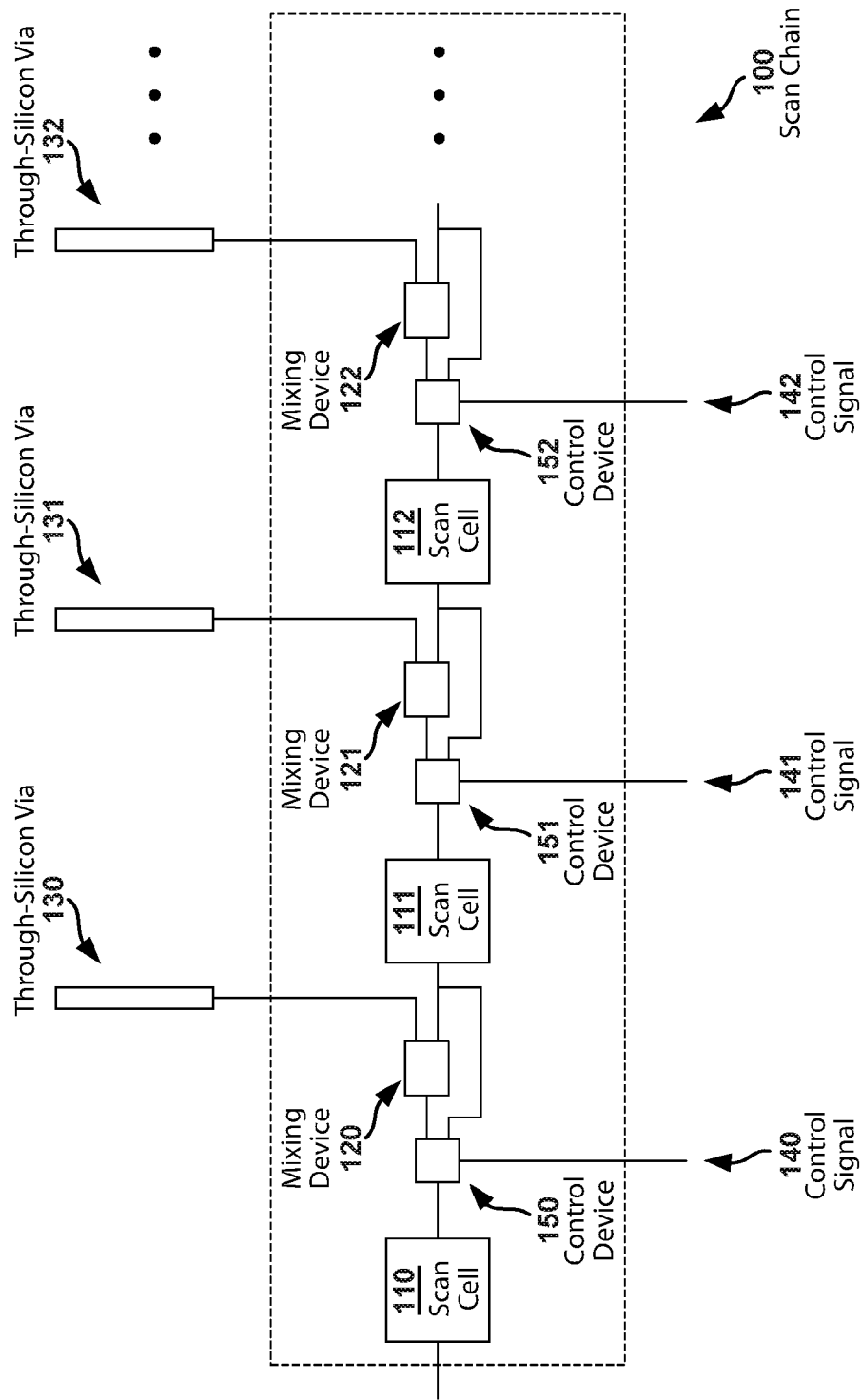
FIG. 1 scan-based test architecture for TSVs according to various embodiments of the invention.

Various aspects of the present invention relate to scan-based test architecture for interconnects in stacked designs. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on one or more non-transitory computer-readable media, software instructions executed on a processor, or some combination of both. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device. Some of the disclosed techniques, for example, can be implemented as part of an electronic design automation (EDA) tool. Such methods can be executed on a single computer or on networked computers.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

The present disclosure also includes some hardware drawings. These drawings are only schematic and are non-limiting. For illustrative purposes, the size of some of the elements in the drawings may be exaggerated and not drawn on scale, and some elements in the drawings may be omitted.

FIG. 1 illustrates scan-based test architecture for TSVs according to various embodiments of the invention. The scan-based test architecture comprises a scan chain 100. Scan cells (e.g., 110, 111 and 112 shown in the figure) on the scan chain 100 are configured to receive data from outputs of neighboring scan cells or outputs of mixing devices (e.g., 120, 121 and 122 shown in the figure) based on bits of a control signal (e.g., 140, 141 and 142 shown in the figure). The mixing devices combine data from through-silicon vias (e.g., 130, 131 and 132 shown in the figure) with data from the outputs of the neighboring scan cells. The control signal is applied to control devices (e.g., 150, 151 and 152 shown in the figure) for selecting which data are allowed to go through.

The mixing devices may be implemented with XOR gates. The control devices may be implemented with multiplexers. The control signal may be supplied by a control register. Alternatively, the control signal may be selected from parallel outputs of a control register and a single signal line based on a selection signal, as will be discussed in detail below.

Figure 2:
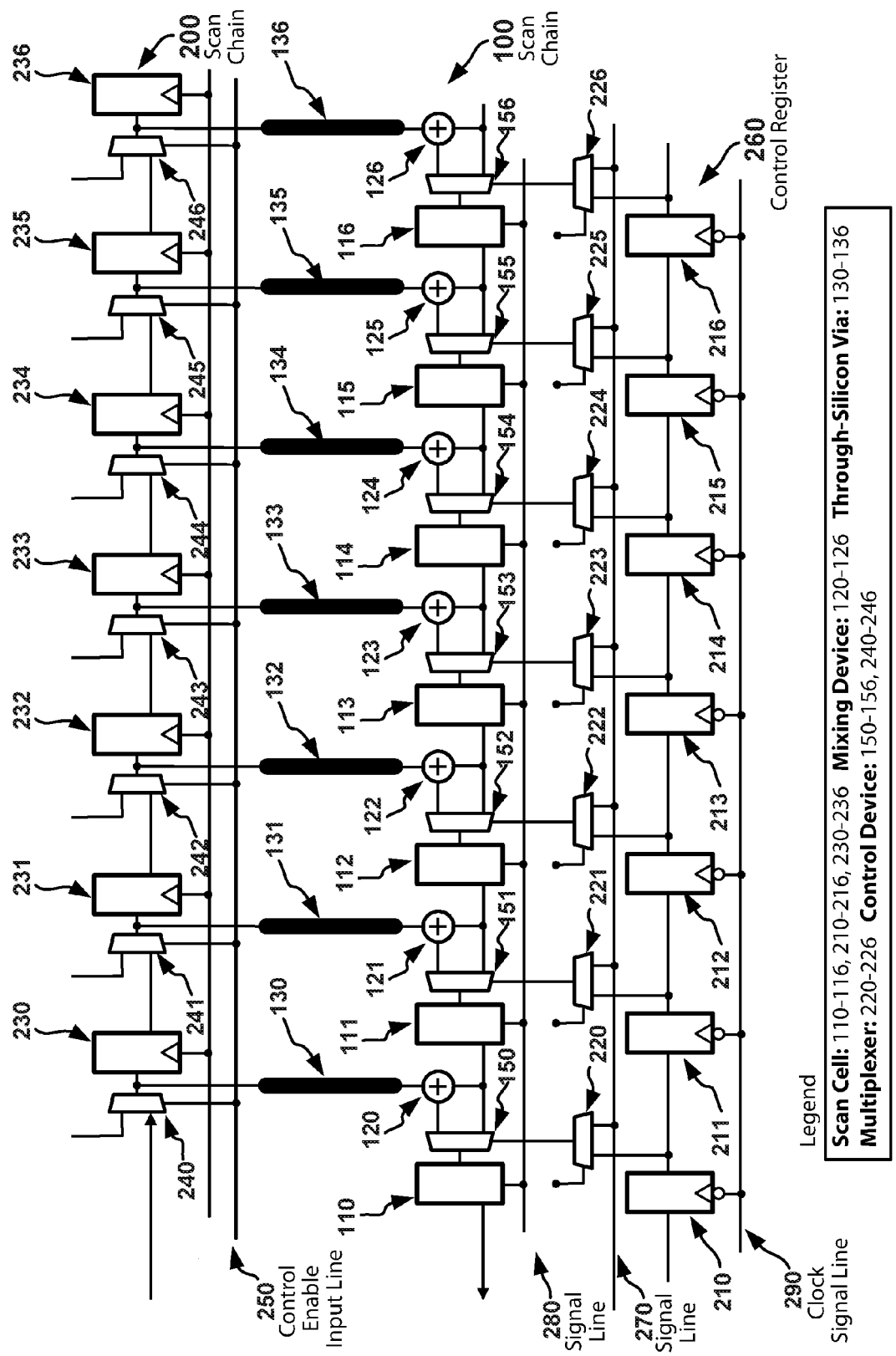
FIG. 2 a detailed example of the scan-based test architecture shown in FIG. 1.

FIG. 2 illustrates a detailed example of the scan-based test architecture shown in FIG. 1. Scan cells 110-116 form part of the scan chain 100. XOR gates 120-126 are used to combine data from outputs of neighboring scan cells with data from outputs of TSVs 130-136. Multiplexers 150-156 select input data for the scan cells from either outputs of the XOR gates 120-126 or the outputs of neighboring scan cells. Selection signal bits for the multiplexers 150-156 are provided by multiplexers 220-226. One input of each of the multiplexers 220-226 is coupled to one of scan cells 210-216, and the other input to a signal line 270. The signal line 280 supplies the selection signal for the multiplexers 220-226. The scan cells 210-216 form a control register 260 for shifting and storing the control signal.

Also shown in the figure is a scan chain 200 comprising scan cells 230-236 on a neighboring die. When the scan enable input 250 is asserted, the scan chain 200 directly feed the TSVs 130-136 with a variety of test stimuli produced by a test pattern generator (TPG), as described later. Otherwise, functional logic is coupled to the TSVs. The scan cells 110-116 and 230-236 may be wrapper cells originally introduced to provide controllability and observability at the die boundary or dedicatedly added for the purpose of TSV test and diagnosis.

During a TSV test, test stimuli are applied to the TSVs 130-136 by the scan chain 200, and test responses from the TSVs 130-136 are being received and stored by the scan chain 100. In this architecture, the scan chain 100 is shifted in a direction opposite to that of the scan chain 200. When the multiplexers 220-226 select bits in the control register 260 to control the multiplexers 150-156, the scan cells 110-116 can be individually controlled at each clock cycle. This may be accomplished by shifting in the control signal one bit per clock cycle. A trailing edge of the clock signal 290 may be used to trigger the control register 260. Consequently, the bits in the control register 260 determine whether each of the scan cells 110-116 receives a corresponding TSV response at a particular scan shift cycle.

When the multiplexers 220-226 select the signal 270 to control the multiplexers 150-156, the scan cells 110-116 operate as either a shift register if the signal 270 is set to 0, or a conventional scan chain observing responses of the TSVs 130-136 if the signal 270 is set to 1. Details of the control register clocking are discussed below. Test results leaving the scan chain may be either sent back to a tester or processed by an on-chip test response compactor such as a multiple input signature register (MISR).

Using the test architecture illustrated in FIG. 2, a single TSV may be selected through the control register 260 for each clock cycle. A test pattern bit that enters the scan chain 200 in a fault-free circuit needs 2k shift cycles to leave the scan chain 100, where k indicates location of this active TSV. This variable propagation time scheme minimizes the probability of fault masking, and can detect and diagnose faults. Furthermore, if the signal line 280 is set to be 0, then by feeding the control register with certain patterns (for example, by shifting-in a pseudorandom vector), and by applying different clocking schemes to the scan chains 100 and 200 as well as the control register 260 itself, one can implement a variety of different TSV test schemes depending on targeted types of defects and other test objectives. It allows confirming that each TSV performs its required functions and that two dies are properly interconnected. In particular, it is of interest to verify that all TSVs are free from structural faults such as stuck-ats, shorts (or bridges), opens (breaks), cross-talks, and various forms of time-related defects. A variety of experimental results that clearly confirm effectiveness, robustness and feasibility of the disclosed test architecture will be explained later.

It is worth noting that, for the sake of illustration, the diagram presented in FIG. 2 is simplified in various ways. For example, the stack consists of two dies only, and the single scan chains serve all TSVs. In reality, the proposed test architecture can be easily used in 3-D stacked designs comprised of anywhere from two to any reasonable number of dies. Furthermore, because of a large number of TSVs, several disjoint scan chains may typically be deployed to drive them. The same rule may be applied to a die or dies with designated scan chains that observe tested TSVs. Hence, the schemes and results disclosed here, even if illustrated with simplified examples, remain valid for more general test cases.

The disclosed test architecture can be used not only to detect possible faults, but also to determine their locations, i.e., to identify all faulty TSVs. Let us assume that any combination of TSVs can be affected by stuck-at, bridging, or open faults. A diagnostic scheme is based on walking 1/0 test sequences, i.e., n-bit long binary vectors that feature a single 1(0) followed by n−1 0s (1s), where n is the number of TSVs driven by the scan chain 200 of FIG. 2. This particular test pattern has a very low noise background, and thus a logic value of 1(0) is distinctly applied to every TSV, one at a time, by gradually shifting a walking 1(0) sequence through the scan chain 200. Furthermore, another walking 1 sequence is shifted into the control register 260, thus activating every TSV, again one at a time (in fact, the control walking 1 pattern is employed twice to serve both the walking 1 and the walking 0 tests). In principle, peculiar test sequences such as the walking 1/0 patterns combined with the disclosed test architecture allow fault diagnosis by monitoring the test response register 100 whose erroneous bits directly correspond to faulty TSVs. Consequently, no additional post-processing of test results is required to identify failing interconnects.

Figure 3:
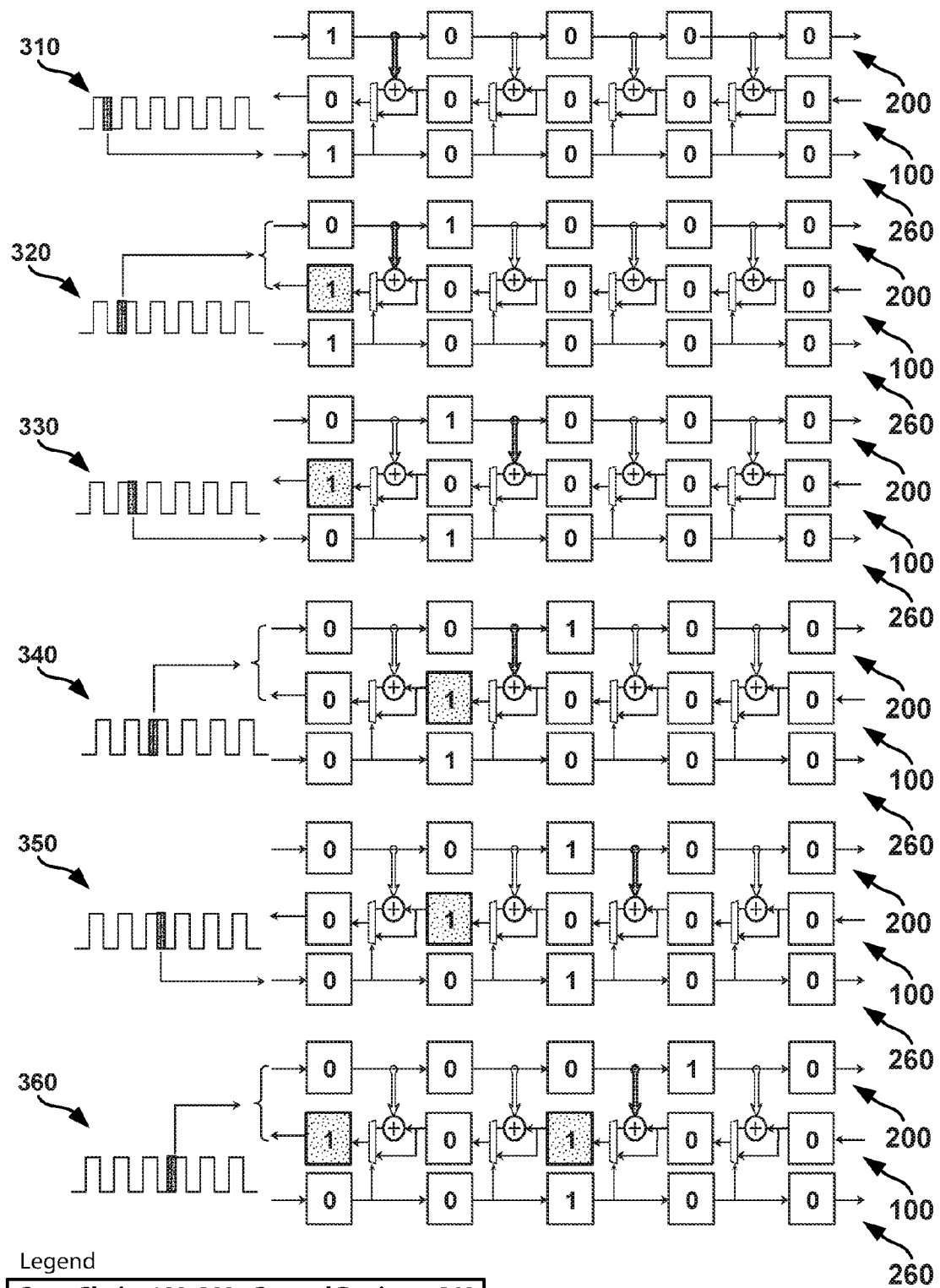
FIG. 3 illustrates application of the walking 1 test pattern for a few successive clock cycles according to various embodiments of the invention.

FIG. 3 illustrates application of the walking 1 test pattern for a few successive clock cycles according to various embodiments of the invention. As noted previously, the control register 260 shifts on the trailing edge of the clock signal. The corresponding red arrows indicate active TSVs in successive test steps. As can be seen in 310 of FIG. 3, the negative edge of the first clock pulse loads a single 1 into the first cell of the control register 260. It enables the leftmost TSV by setting up an active connection through an XOR gate and a multiplexer. The rising edge of the clock signal illustrated in 320 shifts both the scan chain 200 and the scan chain 100. As a result, the value of 1 is stored, after being XOR-ed with the content of the second response cell, in the first cell of the response register 100. The trailing edge of the same clock pulse shifts the content of the control register by one bit in 330, thus activating the next TSV. The test application can now be repeated as shown in 340-360. As can be easily verified, if all TSVs are fault free, then the content of the response register is gradually assuming the following form:

1 0 1 0 1 0 1 0 1 0 1 0 . . .

This 2n-bit vector is either shifted out to a tester, or can be further processed on a chip, as discussed in the following. It is worth noting that, under otherwise similar conditions, applying the walking 0 sequence results in the all-0 test response provided all TSVs are fault-free.

The walking 1 test pattern can detect all TSV stuck-at-0 faults as these faults inject a logic value of 0 into the response register instead of an expected 1. Since a single and designated 1 in the fault-free response represents the corresponding TSV, the disclosed test procedure is capable of detecting and correctly identifying any combination of faulty TSVs. Similarly, the walking 0 can detect and localize any combination of TSVs being stuck-at-1. For example, if the leftmost TSV in FIG. 3 is stuck-at-0, then the recorded test response has the form:

0 0 1 0 1 0 1 0 1 0 . . .

with the first 0 indicating the faulty TSV.

As another example, consider the first and the third TSVs both being stuck-at-1. They yield the following pattern in response to the walking 0 test:

1 0 0 0 1 0 0 0 0 0 0 0 . . .

Again, the presence and locations of two 1 s clearly designate two faulty TSVs.

Bridge defects create unintended connections between two or more TSVs. Deterministic behavior of bridging faults is commonly characterized by wired-AND or wired-OR models. If the drivers of the shorted TSVs are such that a logic 0 (1) dominates, then the resultant logic value delivered by all affected TSVs is an AND (OR) of the logic values carried by individual TSVs. Consequently, a bridging fault must have opposite polarity values across it in order to activate its presence. As can be seen, if two adjacent TSVs are shorted together, then a 1(0) injected through the walking 1(0) pattern is replaced by a 0 for an AND short (a 1 for an OR short). Hence, every bridging fault can be detected and located based on an erroneous test response. Furthermore, every dominant bridging fault, where one TSV is assumed to dominate the logic value on the two shorted TSVs, is also detected and identified. Indeed, as the faulty behavior can only be observed on the dominated TSV, once such TSV becomes active, its fault-free value of 1 (for the walking 1 test) or 0 (for the walking 0 test) is replaced by clearly different value of its dominating neighbor, i.e., 0 or 1, respectively.

Open faults create breaks (or opens) in the faulty TSVs. Although opens tend to behave like stuck-at faults, it might be necessary to apply a 1-0 (0-1) transition to detect failures where the TSV output end is charged to logic 1(0) due to the protection circuitry, parasitic capacitance, etc., and accidental applying of the same value to the TSV input end may lead to a coverage drop. While detection of stuck-at faults is discussed earlier, it is worth noting that the walking 1(0) sequence allows one to force a 1-0 (0-1) transition provided an extra clock pulse is applied exclusively to the response register right after exercising an active TSV with the value of 1(0). If the scan chain 200 and the control register 260 remain both still for this particular clock cycle, then the value of 0(1) that follows the previous 1(0) aims now to complete a transition over the same TSV to see whether it is not affected by an open defect. As before, a wrong response not only exposes an open fault, but also unambiguously indicates its location. Clearly, the test response vector is, in this case, three times longer than the original walking 1(0) test pattern as its 3n-bit fault-free form is as follows:

1 0 0 1 0 0 1 0 0 1 0 0 . . .

Figure 4:
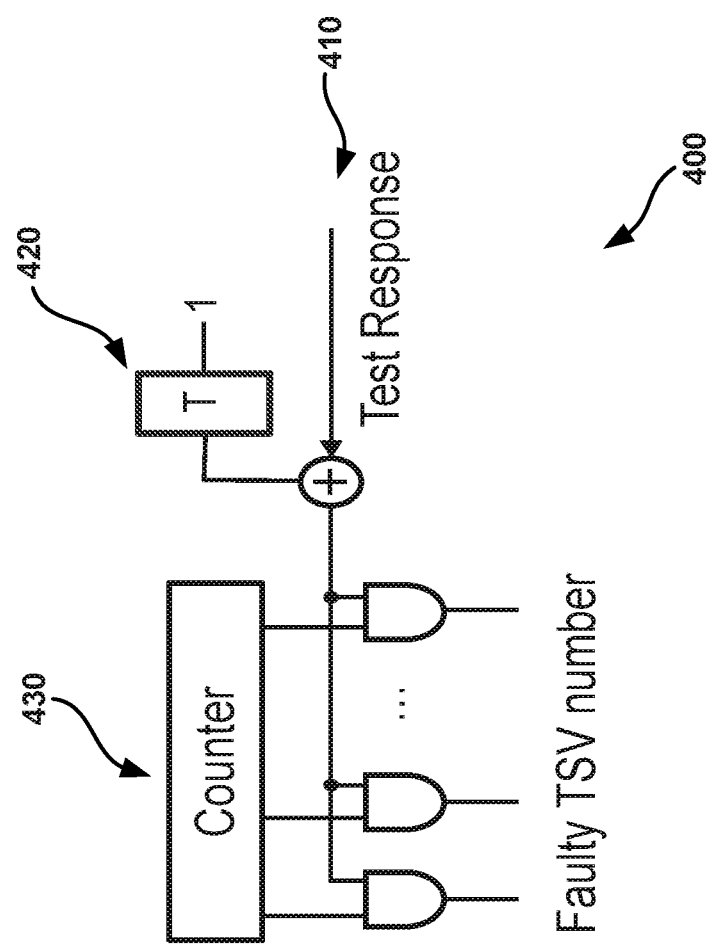
FIG. 4 illustrates an on-chip logic 400 for analyzing diagnose results that may be included in the scan-based test architecture shown in FIG. 2.

FIG. 4 illustrates an on-chip logic 400 for analyzing diagnose results that may be included in the disclosed test architecture. Test result bits 410 leaving the test response chain 100 are serially compared against expected (golden) responses produced by a T-type flip-flop 420. Any discrepancy is immediately presented to gating logic of a binary counter 430 that runs synchronously with the remaining test operations. The logic 400 allows the identity of all faulty TSVs to be revealed gradually. As shown in FIG. 3, the walking 1 test for stuck-at and bridging faults produces a sequence of alternating 0 s and 1 s. This is exactly what the T flip-flop yields on its output when its data input is a constant 1. When the walking 0 test is applied, the actual test response is simply compared against the constant value of 0. A test that targets open defects may require a generator of the golden response different from the flip-flop 420 to accommodate transition-based patterns.

Faulty TSVs may cause unacceptable delays along propagation paths such that the total propagation delay falls outside the specified limit. As far as TSV failures are concerned, it suffices to consider two transition faults: slow to rise and slow to fall, which assume that a delay defect affects a given TSV such that the propagation of a transition launched from the upper scan chain does not reach the response register within the clock period. Following the well-known test procedures, a test pattern for a TSV transition fault may consist of a pair of vectors (v1, v2), where v1 is used to set one of the flip-flops of the scan chain 200 (and thus the corresponding TSV) to an initial state, and v2 launches the corresponding transition and propagates an error to a designated flip-flop of the response register 100.

Figure 5:
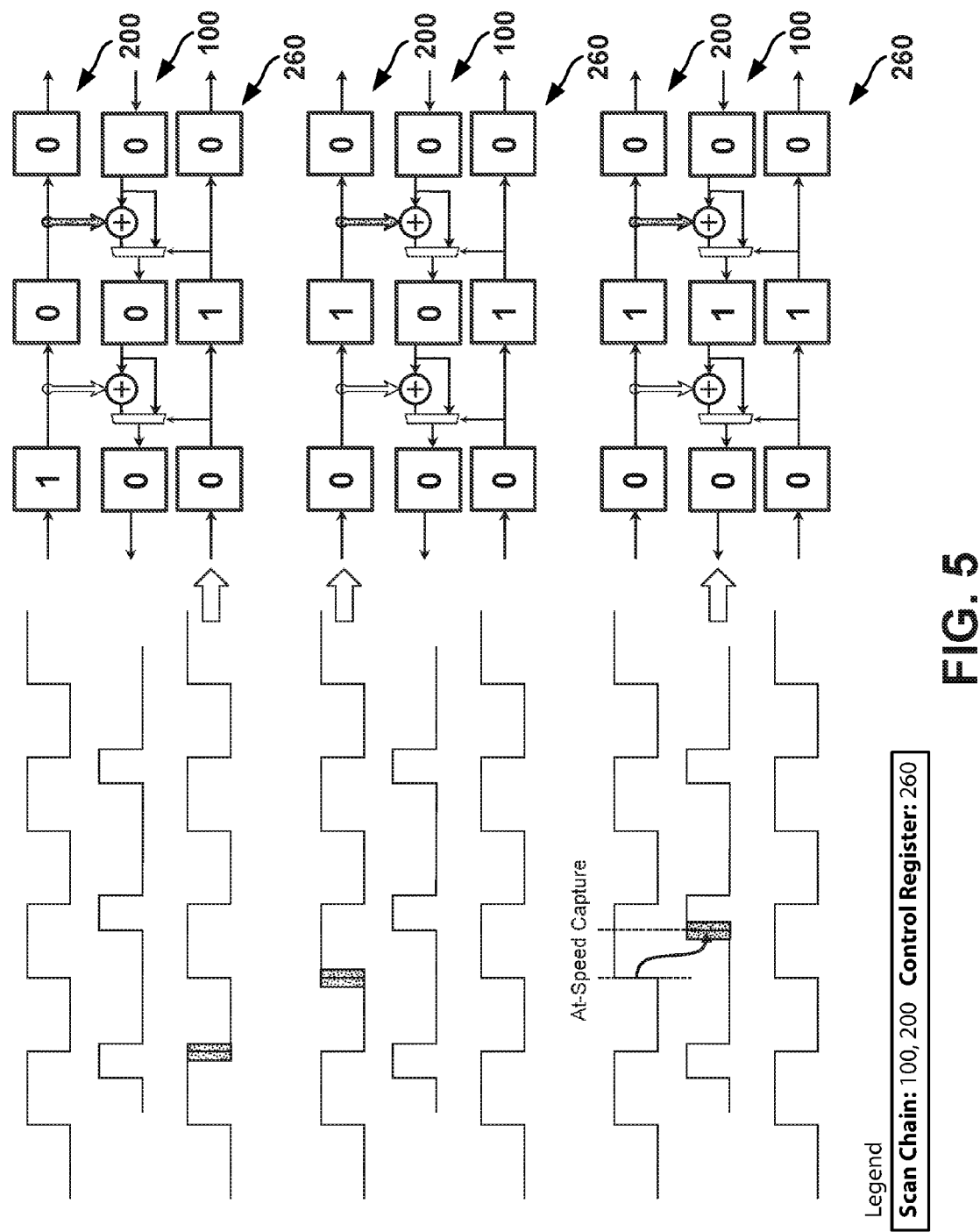
FIG. 5 illustrates an example of clocking synchronization for the registers 100, 200 and 260 shown in FIG. 2.

The walking 1/0 test patterns can be used to detect and diagnose slow-to-rise and slow-to-fall defects. Its application (with another walking 1 sequence moving in parallel within the control register) resembles the launch-off-shift-based testing. Consider, for example, the walking 1 pattern, where the value of 1 is about to reach a given TSV. During the previous cycle, the value of 0 has been applied to this TSV to assume the role of vector v1. The next shift cycle corresponds to vector v2 as it launches the transition from 0 to 1. It should be captured at speed by the following clock cycle applied to the response register 100. If the received response is 0 (instead of the expected 1), then the slow-to-rise transition has been detected and located due to a unique location of the erroneous 0 in a test response. The content of the control register 260 is shifted ahead of the corresponding actions of the scan chain 200 in order to set the entire propagation path that includes the scan chain 200, a particular TSV (e.g. 132), an XOR gate (e.g. 122), and finally a test response flip-flop (e.g. 112). It must be completed before the actual transition is launched. In a similar manner, the walking 0 test has the ability to detect slow-to-fall transitions. This time, the presence of erroneous 1s indicates the location of faulty TSVs. It is worth noting that the walking 1/0 test patterns can be shifted in at a slow speed; however each clock pulse applied to the scan chain 200 must be followed by an at-speed capture as successive transitions are used to examine TSVs, one by one. This approach requires, therefore, a proper synchronization as far as clocking of all involved registers is concerned. This is illustrated in FIG. 5.

As high density interconnects, some TSVs can form capacitors and become sensitive to defects resulting from crosstalk effects. Consequently, it may lead to improper functioning of the entire chip. The parasitic capacitor injects charge from one TSV that makes a transition (aggressor) to a coupled victim TSV. The impact of this noise mechanism depends on whether the victim node is static or transitioning. In the first case, the effect of capacitive crosstalk is a glitch that travels over a TSV to reach the response register 100.

When the victim TSV is also transitioning, capacitive crosstalk impacts the delay of the transition, typically slowing it down.

Figure 6:
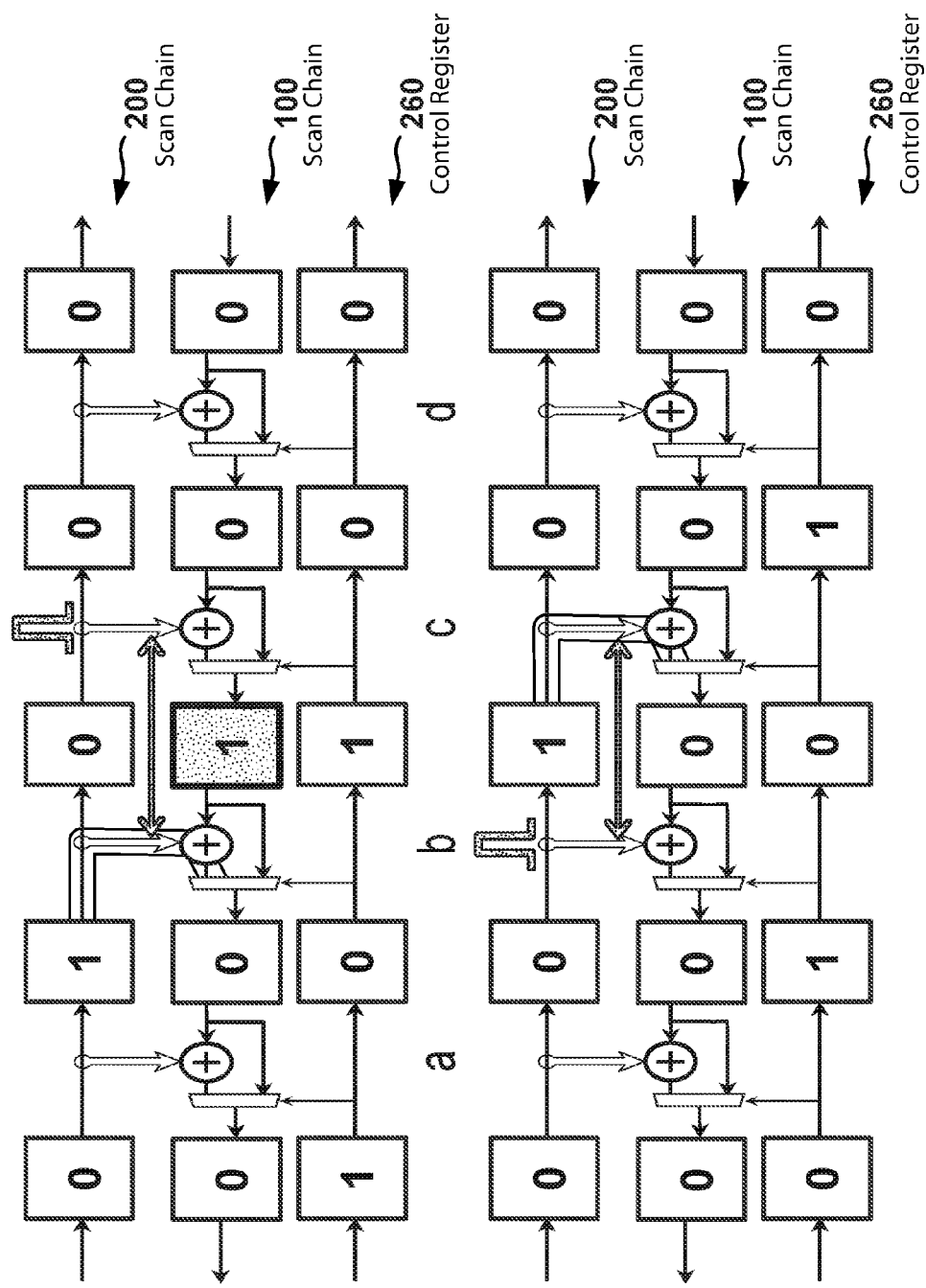
FIG. 6 illustrates an example of fault masking that may happen for neighboring TSVs.

Consider crosstalk-related glitches. Given TSV v, it is assumed that realistically possible faults are couplings between v and its nearest left and right neighbors. While the walking 1/0 test patterns can still be employed, we need to observe TSVs (as opposed to the previous schemes), which are the most adjacent neighbors of those being currently stimulated by the walking 1(0). Thus, application of the walking 1 test sequence consists of two phases. First, a walking 1 pattern is shifted into the control register 260 in such a way that its single 1 always precedes, by one cycle, the pattern being applied to the upper scan chain. Subsequently, the same test is repeated with the walking 1 being shifted again into the control register 260, this time however, with the single 1 always falling one cycle behind the actual test pattern. The erroneous signals stored in the response register 100 not only manifest the presence of faults, but also indicate location of faulty TSVs. Clearly, the above 2-step test procedure needs to be repeated for the walking 0 test pattern It is worth noting that using one common control pattern that allows observing both neighboring TSVs in parallel may lead to fault masking since a recorded glitch invoked by a transition can be subsequently masked by another glitch originating from the same pair of TSVs, as shown in FIG. 6. Let TSVs denoted as TSVs b and c be coupled. First, a glitch occurring on TSV c (due to a transition from 0 to 1 on TSV b) is recorded in the response register 100 as we observe TSVs a and c. Next, another glitch shows up on TSV b after launching a similar transition through TSV c. If we now observe TSV b, then XOR-ing an erroneous signal stored in the response register 100 with an error on TSV b results in the mutual error cancellation.

The walking 1/0 test patterns may not be suitable if one wants to invoke two parallel transitions through adjacent TSVs in order to detect crosstalk-related delays. However, a significant fraction of these defects can be tested by deploying a checkerboard test pattern 0 1 0 1 0 1 0 1 . . . . When shifted into the upper scan chain, it will cause adjacent TSVs to undergo transitions in the opposite directions. The response register must be clocked in a manner similar to that of transition faults (see FIG. 5) to capture any undesirable delays, while the control register 260 operates as introduced for the crosstalk-based glitches, that is, with signals activating TSVs either overtaking or following the exercised TSV by a single clock cycle.

Pseudorandom test patterns can also be loaded into the scan chain 200, while a MISR evaluates test results. These test operations can be conveniently carried out on chip in a BIST environment, as illustrated in FIGS. 2 and 4.

FIG. 7 illustrates a table summarizing experimental results obtained by applying robust test patterns to the test architecture shown in FIG. 2. During the experiments, the control register 260 remains disabled, whereas all TSVs are observed in parallel. Fault coverage is reported for the following single TSV defects: stuck-ats, opens, three types of shorts between two adjacent TSVs, slow-to-rise and slow-to-fall transitions, as well as crosstalk-related failures. Another objective of the experiments is to determine how many faulty TSVs can be identified based solely on the recorded erroneous signatures. Clearly, a fault can be uniquely identified provided that it produces a unique signature, i.e., a signature that cannot be generated by any other fault.

The table in FIG. 7 includes results for three sets of pseudorandom test patterns with different test case sizes and different sizes of a compactor. Each test case is comprised of a given number of TSVs (in the reported experiments 500, 1000, and 2000), the size of a MISR-based test response compactor, and the number of test patterns applied (here 5, 10, and 15). The latter factor is indicative of how many pseudorandom bits have been effectively shifted into the upper scan chain. This particular value can be obtained by multiplying the number of test patterns and the number of TSVs. For example, if 10 test patterns are applied to a setup with 2000 TSVs, then 2000×10=20000 random bits are deployed as test stimuli. The table lists the single fault coverage numbers with respect to the aforementioned eight fault models. Furthermore, it provides the total diagnostic resolution obtained in each case, i.e., the ratio of faults that produced unique signatures to the total number of faults simulated. Note that the diagnostic resolution is reported as a compound coefficient over all assumed fault models As FIG. 7 shows, even a very few test patterns suffice to detect a wide variety of single failures being examined in the experiments. Some occasional incomplete fault coverage cases are primarily attributed to the aliasing phenomena caused by extremely small test response compactors. With the increasing size of a compactor, complete fault coverage is easily attainable. Moreover, it appears that compactors of an appropriate size guarantee very high diagnostic resolution of the scheme. For example, a 16-bit MISR used to collect test results arriving from 500 TSVs after applying 5×500=2500 random bits yields the diagnostic resolution of 93.99%. It indicates that 3756 out of 3996 faults produce unique signatures, and as such they can be unambiguously identified. It is worth noting that this result applies to all simulated faults, including stuck-ats, shorts, and time-related defects. In other words, given the disclosed test architecture shown in FIG. 2, these faults cause erroneous syndromes that are sufficient not only to localize faulty TSVs, but also to identify a failure type.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. An integrated circuit, comprising:
    a scan chain that comprises scan cells, wherein each of the scan cells is associated with a neighboring scan cell, selection circuitry, a mixing device, and a through-silicon via, and wherein each of the scan cells comprises an input that is configured to receive selected data from the selection circuitry;
    wherein the selection circuitry is configured to select, in accordance with a control signal, between providing the input with data from an output of the neighboring scan cell or data from an output of the mixing device; and
    wherein the mixing device comprises a first input configured to receive data from the through-silicon via and a second input configured to receive the data from the output of the neighboring scan cell, and wherein the mixing device is configured to combine the data from the through-silicon via with the data from the output of the neighboring scan cell.

2. The integrated circuit recited in claim 1, further comprising:
a control register configured to shift and/or store the control signal.

3. The integrated circuit recited in claim 1, wherein the control signal is selected, based on a selection signal, from parallel outputs of a control register and a single signal line.

4. The integrated circuit recited in claim 1, wherein the mixing device comprises an XOR gate having the first input and the second input.

5. The integrated circuit recited in claim 1, further comprising:
a comparator configured to compare serial data from an output of the scan chain with good machine response data.

6. The integrated circuit recited in claim 5, further comprising:
a counter; and
a plurality of AND gates configured to receive signals from outputs of the counter and output of the comparator.

7. The integrated circuit recited in claim 1, wherein the scan chain is configured to be shifted in a first direction,
wherein the scan chain is comprised on a die that is associated with a neighboring die,
wherein the through-silicon via provides test stimuli from a second scan chain on the neighboring die, and
wherein the second scan chain is configured to be shifted in a second direction opposite to the first direction.

8. One or more non-transitory processor-readable media storing processor-executable instructions that, when executed, causes one or more processors to create a design of an integrated circuit, the integrated circuit comprising:
a scan chain that comprises scan cells, wherein each of the scan cells is associated with a neighboring scan cell, selection circuitry, a mixing device, and a through-silicon via, and wherein each of the scan cells comprises an input that is configured to receive selected data from the selection circuitry;
wherein the selection circuitry is configured to select, in accordance with a control signal, between providing the input with data from an output of the neighboring scan cell or data from an output of the mixing device; and
wherein the mixing device comprises a first input configured to receive data from the through-silicon via and a second input configured to receive the data from the output of the neighboring scan cell, and wherein the mixing device is configured to combine the data from a through-silicon via with the data from the output of the neighboring scan cell.

9. The one or more non-transitory processor-readable media recited in claim 8, wherein the integrated circuit further comprises:
a control register configured to shift and/or store the control signal.

10. The one or more non-transitory processor-readable media recited in claim 8, wherein the control signal is selected, based on a selection signal, from parallel outputs of a control register and a single signal line.

11. The one or more non-transitory processor-readable media recited in claim 8, wherein the mixing device comprises an XOR gate having the first input and the second input.

12. The one or more non-transitory processor-readable media recited in claim 8, wherein the integrated circuit further comprises:
a comparator configured to compare serial data from an output of the scan chain with good machine response data.

13. The one or more non-transitory processor-readable media recited in claim 12, wherein the integrated circuit further comprises:
a counter; and
a plurality of AND gates configured to receive signals from outputs of the counter and output of the comparator.

14. The one or more non-transitory processor-readable media recited in claim 8,
wherein the scan chain is configured to be shifted in a first direction,
wherein the scan chain is comprises on a die that has a neighboring die,
wherein the through-silicon via provides test stimuli from a second scan chain on the neighboring die, and
wherein the second scan chain is configured to be shifted in a second direction opposite to the first direction.

15. The one or more non-transitory processor-readable media recited in claim 8, wherein the integrated circuit further comprises:
a stack comprising a first die and a second die,
wherein the first die comprises the scan chain, and
wherein the through-silicon via interconnects the first die to the second die.

16. The one or more non-transitory processor-readable media recited in claim 15, wherein the second die comprises a second scan chain, and wherein the integrated circuit further comprises:
first clock circuitry configured to apply a first clocking scheme to the scan chain, and
second clock circuitry configured to apply a second clocking scheme to the second scan chain, wherein the second clocking scheme is different from the first clocking scheme.

17. The one or more non-transitory processor-readable media recited in claim 8, wherein the scan chain comprises an output that provides test result bits for further processing, and wherein the integrated circuit further comprises:
circuitry configured to receive the test result bits, compare the test result bits to an expected response to determine whether the test result bits match the expected response, and determine a location of a faulty through-silicon via if the test result bits do not match the expected response.

18. The integrated circuit recited in claim 1, further comprising:
a stack comprising a first die and a second die,
wherein the first die comprises the scan chain, and
wherein the through-silicon via interconnects the first die to the second die.

19. The integrated circuit recited in claim 18, wherein the second die comprises a second scan chain, and wherein the integrated circuit further comprises:
first clock circuitry configured to apply a first clocking scheme to the scan chain, and
second clock circuitry configured to apply a second clocking scheme to the second scan chain, wherein the second clocking scheme is different from the first clocking scheme.

20. The integrated circuit recited in claim 1, wherein the scan chain comprises an output that provides test result bits for further processing, and wherein the integrated circuit further comprises:

circuitry configured to receive the test result bits, compare the test result bits to an expected response to determine whether the test result bits match the expected response, and determine a location of a faulty through-silicon via if the test result bits do not match the expected response.

21. A method comprising:

receiving, by a first input of a mixing device of an integrated circuit, data from a through-silicon via of the integrated circuit;

receiving, by a second input of the mixing device, data from an output of a first scan cell, wherein a scan chain of the integrated circuit comprises the first scan cell and a second scan cell;

combining, by the mixing device, the data from the through-silicon via and the data from the output of the first scan cell;

providing, via an output of the mixing device, data resulting from the combining to selection circuitry of the integrated circuit; and selecting, by the selection circuitry, in accordance with a control signal, between providing an input of the second scan cell with the data from the output of the first scan cell or the data resulting from the combining.

22. The method of claim 21, wherein the combining is based on an exclusive- or operation.

* * * * *